United States Patent
Johnson

(10) Patent No.: US 9,897,642 B1
(45) Date of Patent: Feb. 20, 2018

(54) DETECTION OF ARCING LOCATION ON PHOTOVOLTAIC SYSTEMS USING FILTERS

(71) Applicant: National Technology & Engineering Solutions of Sandia, LLC, Albuquerque, NM (US)

(72) Inventor: Jay Johnson, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 192 days.

(21) Appl. No.: 14/643,032

(22) Filed: Mar. 10, 2015

Related U.S. Application Data

(60) Provisional application No. 61/971,247, filed on Mar. 27, 2014.

(51) Int. Cl.
*G01R 31/08* (2006.01)
*H01L 31/05* (2014.01)
*H01L 31/02* (2006.01)
*G01R 31/02* (2006.01)

(52) U.S. Cl.
CPC ......... *G01R 31/086* (2013.01); *G01R 31/021* (2013.01); *H01L 31/02021* (2013.01); *H01L 31/05* (2013.01)

(58) Field of Classification Search
CPC ............... G01R 31/086; G01R 31/021; H01L 31/02021; H01L 31/05
USPC ....... 377/77, 78, 79, 80; 361/42; 307/77, 78, 307/79, 80
See application file for complete search history.

(56) References Cited

U.S. PATENT DOCUMENTS

| | | | |
|---|---|---|---|
| 8,218,274 B2 * | 7/2012 | Hastings | H01L 31/02021 361/42 |
| 8,547,669 B2 | 10/2013 | Larson et al. | |
| 2013/0015875 A1 | 1/2013 | Kumar | |
| 2013/0094112 A1 * | 4/2013 | Burghardt | H01L 31/02021 361/42 |
| 2013/0335861 A1 | 12/2013 | Laschinski et al. | |
| 2014/0168835 A1 * | 6/2014 | Fornage | H02H 7/20 361/57 |

FOREIGN PATENT DOCUMENTS

| | | |
|---|---|---|
| WO | WO 2004/010556 A2 | 1/2004 |
| WO | WO 2011/151267 A2 | 12/2011 |
| WO | WO 2012/159652 A1 | 11/2012 |
| WO | WO 2013/037740 A2 | 3/2013 |
| WO | WO 2014/015947 | 1/2014 |

OTHER PUBLICATIONS

U.S. Appl. No. 14/023,296, filed Sep. 10, 2013, Johnson, Jay.

(Continued)

*Primary Examiner* — John Poos
(74) *Attorney, Agent, or Firm* — Daniel J. Jenkins

(57) ABSTRACT

The present invention relates to photovoltaic systems capable of identifying the location of an arc-fault. In particular, such systems include a unique filter connected to each photovoltaic (PV) string, thereby providing a unique filtered noise profile associated with a particular PV string. Also described herein are methods for identifying and isolating such arc-faults.

25 Claims, 9 Drawing Sheets

(56) References Cited

OTHER PUBLICATIONS

U.S. Appl. No. 14/286,537, filed May 23, 2014, Johnson, Jay.

Alam MK et al., "PV faults: Overview, modeling, prevention and detection techniques," *Proceedings of the 2013 14th IEEE Workshop on Control and Modeling for Power Electronics (COMPEL)*, held on Jun. 23-26, 2013 in Salt Lake City, UT (7 pages).

Armijo KM et al., "Characterizing fire danger from low power photovoltaic arc-faults," *Proceedings of the 2014 40th IEEE Photovoltaic Specialists Conference (PVSC)*, held Jun. 8-13, 2014 in Denver, CO (SAND Technical Report No. SAND2014-1108A) (3 pages).

Flicker J et al., "Electrical Simulations of Series and Parallel PV Arc-Faults," *Proceedings of the 2013 39th IEEE Photovoltaic Specialists Conference (PVSC)*, held Jun. 17-20, 2013 in Tampa, FL (SAND Technical Report No. SAND2013-4979C) (8 pages).

Flicker JD et al., "Photovoltaic ground fault and blind spot electrical simulations," Sandia Report No. SAND2013-3459, Jun. 2013 (79 pages).

Johnson J et al., "Accelerated life testing of PV arc-fault detectors," *Proceedings of the 2013 39th IEEE Photovoltaic Specialists Conference (PVSC)*, held Jun. 17-20, 2013 in Tampa, FL (SAND Technical Report No. SAND2013-4831C) (6 pages).

Johnson J et al., "Arc-fault detector algorithm evaluation method utilizing prerecorded arcing signatures," *Proceedings of the 2012 38th IEEE Photovoltaic Specialists Conference (PVSC)*, held Jun. 3-8, 2012 in Austin, TX (SAND Technical Report No. SAND2012-4442C) (5 pages).

Johnson J et al., "Characterizing PV arcing conditions with impedance spectroscopy and frequency response analysis," *Proceedings of the 26th European Photovoltaic Solar Energy Conference and Exhibition*, held Sep. 5-9, 2011 in Hamburg, Germany (SAND Technical Report No. SAND2011-6310C) (6 pages).

Johnson J et al., "Creating dynamic equivalent PV circuit models with impedance spectroscopy for arc fault modeling," *Proceedings of the 2011 37th IEEE Photovoltaic Specialists Conference (PVSC)*, held Jun. 19-24, 2011 in Seattle, WA (6 pages).

Johnson J et al., "Creating dynamic equivalent pv circuit models with impedance spectroscopy for arc-fault modeling," Sandia Report No. SAND2011-4247, Jun. 2011 (25 pages).

Johnson J et al., "Crosstalk nuisance trip testing of photovoltaic DC arc-fault detectors," *Proceedings of the 2012 38th IEEE Photovoltaic Specialists Conference (PVSC)*, held Jun. 3-8, 2012 in Austin, TX (SAND Technical Report No. SAND2012-4441C) (5 pages).

Johnson J et al., "Differentiating series and parallel photovoltaic arc-faults," *Proceedings of the 2012 38th IEEE Photovoltaic Specialists Conference*, held Jun. 3-8, 2012 in Austin, TX (SAND Technical Report No. SAND2012-4443C) (7 pages).

Johnson J et al., "Electrical and thermal finite element modeling of arc faults in photovoltaic bypass diodes," Sandia Report No. SAND2012-0743, Jan. 2012 (33 pages).

Johnson J et al., "Photovoltaic DC arc fault detector testing at Sandia National Laboratories," *Proceedings of the 2011 37th IEEE Photovoltaic Specialists Conference (PVSC)*, held Jun. 19-24, 2011 in Seattle, WA (SAND Technical Report No. SAND2011-3871C) (6 pages).

Johnson J et al., "Preliminary photovoltaic arc-fault prognostic tests using sacrificial fiber optic cabling," Sandia Report No. SAND2013-1185, Feb. 2013 (21 pages).

Johnson J et al., "Series and parallel arc-fault circuit interrupter tests," Sandia Report No. SAND2013-5916, Jul. 2013 (25 pages).

Johnson J et al., "Using PV module and line frequency response data to create robust arc fault detectors," *Proceedings of the 26th European Photovoltaic Solar Energy Conference and Exhibition*, held Sep. 5-9, 2011 in Hamburg, Germany (SAND Technical Report No. SAND2011-6307C) (6 pages).

Mync, p. et al., PV systems ground faults'< solarPro Mag. Aug./Sep. 2009 2.5:60-72).

Riley D et al., "Photovoltaic prognostics and heath management using learning algorithms," *Proceedings of the 2012 38th IEEE Photovoltaic Specialists Conference (PVSC)*, held Jun. 3-8, 2012 in Austin, TX (SAND Technical Report No. SAND2012-7148C) (5 pages).

Schimpf F et al., "Recognition of electric arcing in the DC-wiring of photovoltaic systems," *Proceedings of the 2009 31st International Telecommunications Energy Conference (INTELEC 2009)*, held Oct. 18-22, 2009 in Incheon, South Korea (6 pages).

Texas Instruments, "SM73201, SM73307, SM73308: Application Note 2154 SolarMagic SM73201 DC Arc Detection Evaluation Board," Literature Number: SNOA564A, 2011 (15 pages).

\* cited by examiner

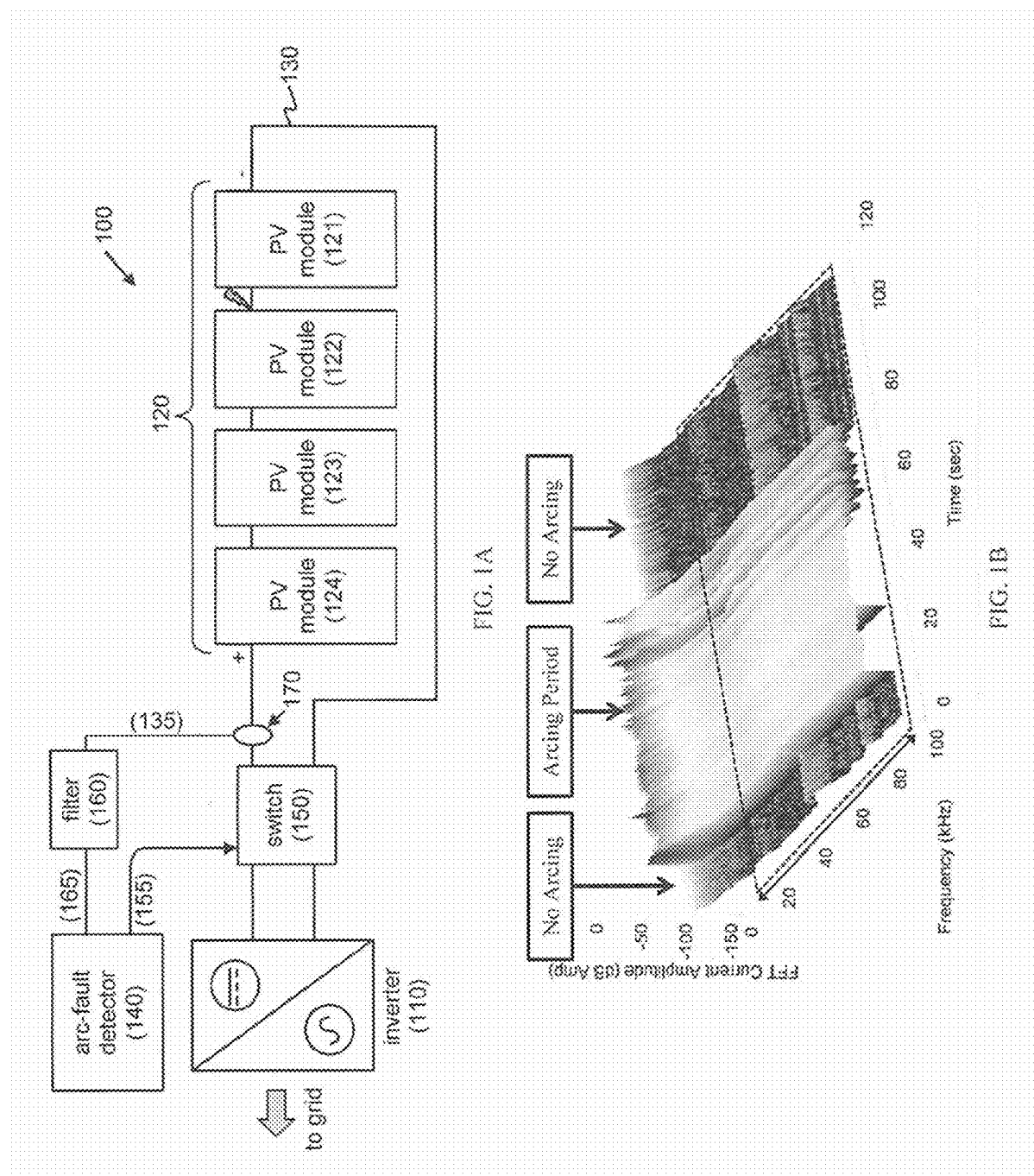

DETECTION OF ARCING LOCATION ON PHOTOVOLTAIC SYSTEMS USING FILTERS

CROSS-REFERENCE TO RELATED APPLICATIONS

This application claims benefit of U.S. Provisional Patent Application No. 61/971,247, "DETECTION OF ARCING LOCATION ON PHOTOVOLTAIC SYSTEMS USING FILTERS," filed Mar. 27, 2014, which is incorporated by reference herein in its entirety.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to photovoltaic systems capable of identifying the location of an arc-fault. In particular, such systems include a unique filter connected to each photovoltaic (PV) string, thereby providing a unique filtered noise profile associated with that particular PV string. Also described herein are methods for identifying and isolating such arc-faults.

BACKGROUND OF THE INVENTION

Photovoltaic (PV) systems generally include numerous PV strings, where each PV string can include a number of PV modules that are connected in series and/or in parallel. Each PV module, in turn, includes an array of solar cells, and each solar cell collects solar radiation for conversion into usable current.

Roof-mounted PV systems complying with the 2011 National Electrical Code® (NEC) and all PV systems complying with the 2014 NEC include an arc-fault detector (AFD) to determine the presence of an arc-fault. Detecting and de-energizing of arc-faults are critical to minimize uncontrolled electrical fires. Many AFDs use frequency content of the PV string for arc detection. For instance, arc-faults are associated with high frequency noise in the PV string. However, noise can also arise from other sources in the PV system, such as electromagnetic coupling (crosstalk), inverter switching, and other radio frequency (RF) effects. To minimize false identification of arc-faults, AFDs generally measure current or voltage over multiple frequencies. The presence of a spike in AC noise across multiple frequencies provides a greater likelihood that an arc-fault is present in the PV system.

Although AFDs can detect the presence of an arc-fault, they cannot provide the location of such an arc-fault. Thus, the topology of some PV systems employs multiple AFDs, where at least one AFD is associated with each PV string. In this way, if the AFD for that particular PV string detects an arc-fault, then that AFD provides a signal to a switch in order to isolate and de-energize that PV string. Such a topology can be very costly and inefficient, especially if a system has numerous PV strings, thereby necessitating numerous AFDs. Thus, additional systems and methods are required for selectively identifying the location of an arc-fault and isolating the PV strings associated with that arc-fault location.

SUMMARY OF THE INVENTION

Accordingly, the present invention relates to a PV system employing a unique filter for each PV string of interest. Thus, each PV string is associated with a filter having a unique cutoff frequency $f_n$ or a unique range of cutoff frequencies (e.g., a range of from $f_{n,low}$ to $f_{n,high}$, such as for a bandpass filter). In this configuration, AC noise for a particular PV string will be filtered by its associated filter. The resultant filtered AC noise profile will have a cutoff frequency of a value near or about the $f_n$ value of the associated filter. Of course, if the filter encompasses a unique range of cutoff frequencies, then the resultant filtered noise profile will have a cutoff frequency range. By recalling the location of that associated filter, the location of the arc-fault is identified.

Multiple PV strings with different filters (e.g., low-pass or notch filter cutoffs) having unique $f_n$ can be connected to a single detector, and the filtered noise would indicate which string to de-energize. In this manner, the number of arc detectors required on PV systems can be reduced by employing a unique filter for each string of interest. This would potentially lower the cost of becoming NEC 690.11 compliant and/or certified to Underwriters Laboratories 1699B.

Accordingly, the invention features a PV system including a first PV string, where the first PV string includes a plurality of first PV modules and a first connector configured to connect the plurality of first PV modules; a first filter configured to receive an electrical signal from the first connector, where the first filter has a cutoff frequency $f_1$ or a range of cutoff frequencies $f_{1,low}$ to $f_{1,high}$; a first switch configured to connect or disconnect the first connector; a second PV string, where the second PV string includes a plurality of second PV modules and a second connector configured to connect the plurality of second PV modules; a second filter configured to receive an electrical signal from the second connector, where the second filter has a cutoff frequency $f_2$ or a range of cutoff frequencies $f_{2,low}$ to $f_{2,high}$ that is different than $f_1$ or range of $f_{1,low}$ to $f_{1,high}$, if present; and a second switch configured to connect or disconnect the second connector.

In further embodiments, the system includes a first probe to measure an electrical parameter (e.g., current, voltage, etc.). In some embodiments, the first probe is configured to receive an electrical signal (e.g., from the first connector or first PV string). In yet other embodiments, the first filter is configured to receive an electrical signal (e.g., an electrical parameter, such as current, voltage, etc.) from the first probe. In other embodiments, the system includes a plurality of probes and a plurality of PV strings, and each PV string includes at least one probe configured to receive an electrical signal (e.g., from the connector or PV string).

In some embodiments, the filter (e.g., first and/or second filter) is electrically connected to a positive and/or negative direct current input of the first PV string.

In some embodiments, the filter and switch (e.g., first filter and switch and/or second filter and switch) are arranged in parallel in the photovoltaic system. The filter and switch can have any useful arrangement. In one non-limiting embodiment, the filter is located closer to the PV string, as compared to the switch. In another non-limiting embodiment, the first switch is located closer to the PV string, as compared to the filter.

In some embodiments, the system includes an arc-fault detector (AFD) (e.g., configured to receive a filtered electrical signal from each of the first and second filters and to transmit a switching signal to each of the first and second switches). In particular embodiments, the AFD includes an analog front end configured to receive the filtered electrical signal; an analog-to-digital converter configured to convert the filtered electrical signal to a digital signal; and a microcontroller configured to analyze the digital signal for the presence of an arc-fault (e.g., where the microcontroller includes an algorithm configured to: determine a presence of an arc-fault in the digital signal; identify an arcing noise cutoff frequency $f_{an}$ for the digital signal; compare the arcing noise cutoff frequency $f_{an}$ with the cutoff frequencies of an $n^{th}$ filter (e.g., $f_n$ or range of $f_{n,low}$ to $f_{n,high}$, such as $f_1$, $f_{1,low}$ to $f_{1,high}$, $f_2$, and $f_{2,low}$ to $f_{2,high}$, if present); and transmit a switching signal to an $n^{th}$ switch if $f_{an}$ is comparable to $f_n$ or range off, $f_{n,low}$ to $f_{n,high}$ (e.g., transmit the switching signal to the first switch if $f_{an}$ is comparable to $f_1$ or range of $f_{1,low}$ to $f_{1,high}$ or transmit the switching signal to the second switch if $f_{an}$ is comparable to $f_2$ or range of $f_{2,low}$ to $f_{2,high}$).

In further embodiments, the system includes one or more combiners (e.g., configured to combine an electrical signal from each of the PV strings and/or connectors and to transmit a single electrical output); one or more recombiners (e.g., configured to combine the single electrical output from each of the plurality of combiners and to transmit a recombined electrical output); an inverter configured to receive an electrical output (e.g., the single electrical output from the combiner and/or the recombined electrical output from the recombiner); and/or one or more filters (e.g., configured to receive an electrical signal from the combiner(s) and/or recombiner(s)).

In some embodiments, the PV system includes a plurality of PV strings, connectors, filters, and switches (e.g., as described herein). In particular embodiments, the system includes n PV string(s) and n connector(s), where each $n^{th}$ PV string includes a plurality of PV modules and where each $n^{th}$ connector is configured to connect the plurality of PV modules in one $n^{th}$ PV string; n filter(s), where each $n^{th}$ filter is configured to receive an electrical signal from one $n^{th}$ connector, each $n^{th}$ filter has a cutoff frequency $f_n$ or range of cutoff frequencies $f_{n,low}$ to $f_{n,high}$ and each $f_n$ or range of $f_{n,low}$ to $f_{n,high}$ is different; and n switch(es), where each $n^{th}$ switch is configured to connect or disconnect one $n^{th}$ connector, where n is an integer of from 1 to 1000 (e.g., from 1 to 10, 1 to 20, 1 to 50, 1 to 100, 1 to 300, 1 to 500, 1 to 800, 10 to 20, 10 to 50, 10 to 100, 10 to 300, 10 to 500, 10 to 800, 10 to 1000, 50 to 100, 50 to 300, 50 to 500, 50 to 800, 50 to 1000, 100 to 300, 100 to 500, 100 to 800, or 100 to 1000).

In particular embodiments, the PV system includes a plurality of subarrays. In some embodiments, one or more PV strings (e.g., the first and second PV strings) are located in a first subarray. In other embodiments, the system further includes a third filter configured to receive an electrical signal from the first subarray, where the third filter has a cutoff frequency $f_3$ or a range of cutoff frequencies $f_{3,low}$ to $f_{3,high}$ that is different than any other filter in the system (e.g., where each of $f_1$, range of $f_{1,low}$ to $f_{1,high}$, $f_2$, range of $f_{2,low}$ to $f_{2,high}$, $f_3$, and range of $f_{3,low}$ to $f_{3,high}$, if present, is different).

In other embodiments, the system further includes a second subarray (e.g., where the second subarray includes one or more PV strings and a fourth filter having a cutoff frequency $f_4$ or a range of cutoff frequencies $f_{4,low}$ to $f_{4,high}$). In some embodiments, cutoff frequency $f_4$ or a range of $f_{4,low}$ to $f_{4,high}$ that is different than any other filter in the system (e.g., where each of $f_1$, range of $f_{1,low}$ to $f_{1,high}$ $f_2$, range of $f_{2,low}$ to $f_{2,high}$, $f_3$, range of $f_{3,low}$ to $f_{3,high}$, $f_4$, and range of $f_{4,low}$ to $f_{4,high}$, if present, is different). In other embodiments, the first PV string is located in a first subarray, and the second PV string is located in a second subarray. In yet other embodiments, the first subarray includes a third filter, and the second subarray includes a fourth filter.

The present invention also features a PV system including a plurality of PV strings, where each PV string includes a plurality of PV modules; a plurality of connectors, where each connector is configured to connect the PV modules of one PV string; a plurality of filters, where each filter is configured to receive an electrical signal from one connector and each filter has a different cutoff frequency; a plurality of switches, where each switch is configured to connect or disconnect one connector; an arc-fault detector configured to receive a plurality of filtered electrical signals and to transmit a plurality of switching signals; a combiner configured to combine an electrical signal from each connector and to transmit a combined signal; and an inverter configured to receive the combined signal.

The present invention also features a method of identifying the location of an arc-fault in a PV system and isolating the arc-fault. In some embodiments, the method includes obtaining a plurality of filtered current signals; analyzing the filtered current signals to determine a presence of an arc-fault in a PV string; identifying an arcing noise cutoff frequency if one or more filtered current signals includes the arc-fault; comparing the arcing noise cutoff frequency with the cutoff frequency of one or more filters in the PV system; and identifying the filter having a cutoff frequency near or about the arcing noise cutoff frequency. In some embodiment, the method further includes opening a switch associated with the identified filter, thereby identifying and isolating the arc-fault in the PV system.

In some embodiments, the method includes obtaining a plurality of first filtered current signals having a cutoff frequency $f_1$ or a range of cutoff frequencies $f_{1,low}$ to $f_{1,high}$, where each first filtered current signal is obtained at a different frequency and measured for a first connector configured to connect a plurality of PV modules of a first PV string; analyzing the first filtered current signals to determine a presence of an arc-fault in the first PV string; identifying an arcing noise cutoff frequency $f_{a1}$ if the first filtered current signals includes the arc-fault; comparing the arcing noise cutoff frequency $f_{a1}$ with the cutoff frequency $f_1$ or the range of $f_{1,low}$ to $f_{1,high}$; and opening a first switch connected to the first PV string if $f_{a1}$ is comparable to $f_1$ or the range of $f_{1,low}$ to $f_{1,high}$, thereby identifying and isolating the arc-fault in the PV system.

In some embodiments, the method includes obtaining a plurality of $n^{th}$ filtered current signals having a cutoff frequency $f_n$ or a range of cutoff frequencies $f_{n,low}$ to $f_{n,high}$, where each $n^{th}$ filtered current signal is obtained at a different frequency and measured for an $n^{th}$ connector configured to connect a plurality of PV modules of an $n^{th}$ PV string; analyzing the $n^{th}$ filtered current signals to determine a presence of an arc-fault in the $n^{th}$ PV string; identifying an arcing noise cutoff frequency $f_{an}$ if the $n^{th}$ filtered current signals includes the arc-fault; comparing the arcing noise cutoff frequency $f_{an}$ with the $f_n$ or the range of $f_{n,low}$ to $f_{n,high}$; and opening an $n^{th}$ switch connected to the $n^{th}$ PV string if $f_{an}$ is comparable to $f_n$ or the range of $f_{n,low}$ to $f_{n,high}$.

In some embodiments, the method includes, prior to the obtaining step, injecting a noise signal into the PV system, where the noise signal is used to provide the plurality of first and/or second filtered current signals. In further embodiments, the method includes opening a first switch connected to the first PV string if $f_{a1}$ does not include $f_1$ or the range $f_{1,low}$ to $f_{1,high}$. In yet other embodiments, the method includes opening an $n^{th}$ switch connected to an $n^{th}$ PV string if $f_{an}$ does not include $f_n$ or the range of $f_{n,low}$ to $f_{n,high}$.

In another aspect, the invention features methods of identifying the location of an arc-fault or a break in a PV system. These methods can employ any useful PV system (e.g., any described herein).

In one embodiment, the method includes measuring a filtered noise signal in the system; identifying one or more noise cutoff frequencies $f_{an}$; and comparing $f_{an}$ with cutoff frequency $f_n$ or the range of $f_{n,low}$ to $f_{n,high}$ for one or more filters in the system, thereby identifying the arc-fault or the break in the PV system.

In some embodiments, the method includes, prior to the measuring step, injecting a noise signal (e.g., a broadband noise signal) to provide the filtered noise signal.

The filtered noise signal can be obtained at any useful location in the PV system. In one embodiment, the measuring step includes measuring the filtered noise signal in a connector of the system. In particular embodiments, the method further includes, after the comparing step, identifying the break in an $n^{th}$ PV string if $f_{an}$ does not include $f_n$ or the range of $f_{n,low}$ to $f_{n,high}$.

In another embodiment, the measuring step includes measuring the filtered noise signal in a ground bond of the system. In particular embodiments, the method further includes, after the comparing step, identifying the arc-fault in an $n^{th}$ PV string if $f_{an}$ includes $f_n$ or the range of $f_{n,low}$ to $f_{n,high}$.

In yet another embodiment, the measuring step includes measuring the filtered noise signal in an arc-fault detector of the system. In particular embodiments, the method further includes, after the comparing step, identifying the arc-fault in an $n^{th}$ PV string if $f_{an}$ includes $f_n$ or the range of $f_{n,low}$ to $f_{n,high}$.

The present invention includes the use of filters that each have a cutoff frequency $f_n$ or range of cutoff frequencies $f_{n,low}$ to $f_{n,high}$. In particular, each filter has a different $f_n$ or $f_{n,low}$ to $f_{n,high}$ value. This difference can be of any sufficient value that allows for distinguishing between two or more filters. In particular embodiments, each filter (e.g., first, second, and $n^{th}$ filters) is, independently, selected from the group of a low bandpass filter, a notch filter, an analog filter, a digital filter, an active filter, a passive filter, a discrete-time (sampled) filter, a continuous-time filter, a high-pass filter, low-pass filter, a bandpass filter, and a pi filter.

Definitions

As used herein, the term "about" means +/−10% of any recited value. As used herein, this term modifies any recited value, range of values, or endpoints of one or more ranges.

Other features and advantages of the invention will be apparent from the following description and the claims.

BRIEF DESCRIPTION OF THE DRAWINGS

FIG. 1A shows a schematic of an exemplary PV system 100 having a filter 160 and a switch 150 associated with a particular PV string 120, where the arrow and dashed box indicates the region for the attenuated signal for an exemplary cutoff frequency $f_n$ of 10 kHz for filter 160.

FIG. 1B shows a noise profile showing current and frequency measurements on a DC line, where the arrow and dashed box indicates the region for the attenuated signal for an exemplary cutoff frequency $f_n$ of 10 kHz for filter 160.

DETAILED DESCRIPTION OF THE INVENTION

Figure 2A:
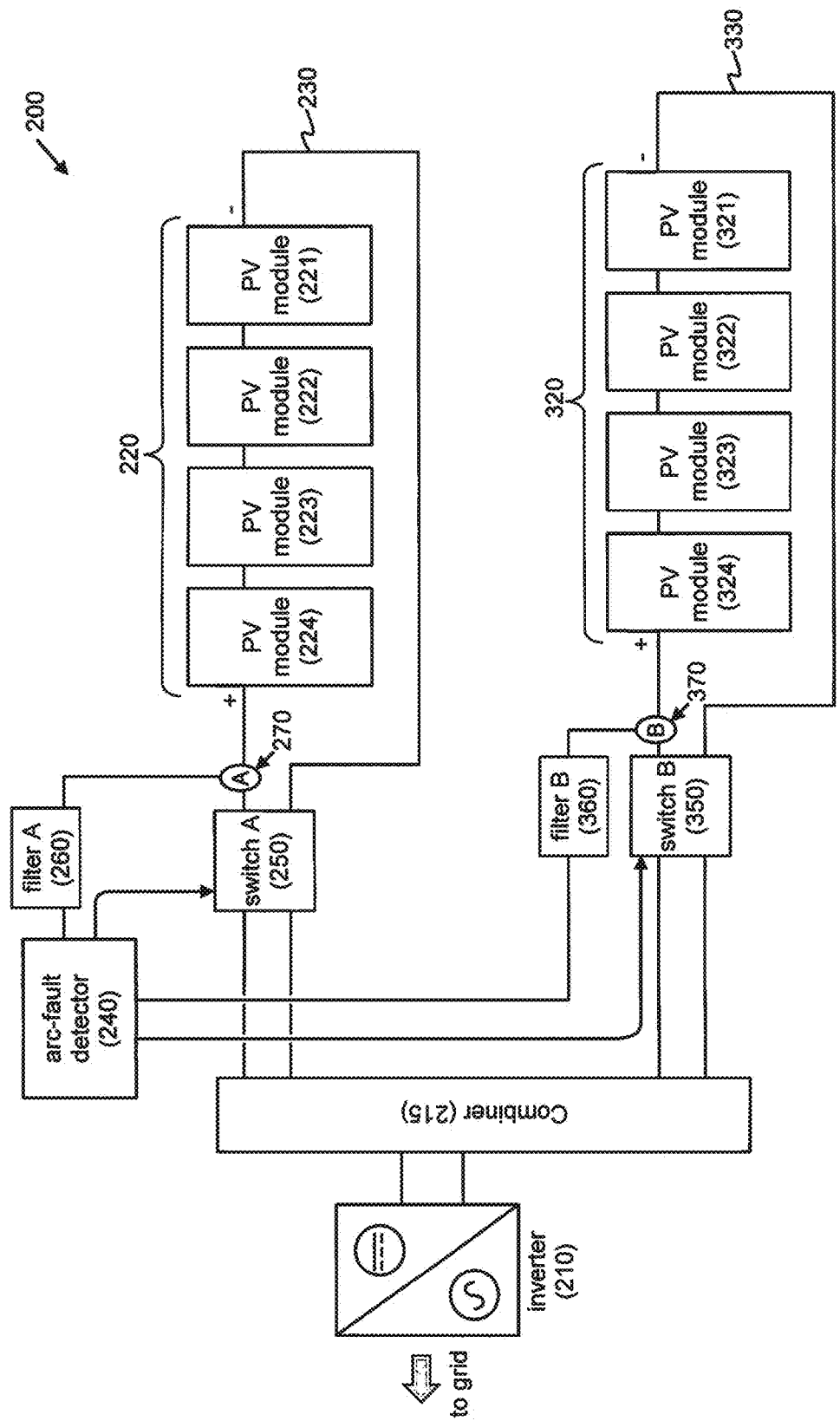
FIG. 2A shows a schematics of another exemplary PV systems having two PV strings having an exemplary system 200 with filters 260, 360 on the current measurement. The filter/switch order can be reversed. The arc-fault detector (AFD) 240, 1240 can be located in any useful position of the system. Thus, noise from each of the strings can be collected and then filtered before being sent to the AFD (e.g., as in FIGS. 2A and 2B) or the AFD can be located somewhere else.

The present invention relates to PV systems having filter(s) configured to identify the location of an arc-fault within the PV system. Such systems can also have additional components (e.g., switches, etc.), as described herein.

An exemplary PV system 100 is shown in FIG. 1A. The system 100 includes a single PV string 120, which includes a plurality of PV modules 121-124. Each of these modules can include a plurality of solar cells. The string 120 includes a connector 130, which is configured to electrically connect each module. A switch 150 is configured to electrically connect or disconnect the connector 130. For instance, the switch 150 can be a contactor or a semiconductor switch (e.g., any described herein). The filter 160 is configured to receive an electrical signal 135 from the current probe 170 and to transmit a filtered electrical signal 165. In FIG. 1A, the filter 160 is connected to the positive direct current input (labeled "+") of the PV string 120. The filter can be located in any useful location, such as on the positive DC input, the negative DC input, both positive and negative inputs, before the combiner, or after the combiner.

The filtered signal 165 from the PV string 120 is transmitted to an arc-fault detector (AFD) 140, which processes that signal to determine whether an arc-fault is present in the PV string 120. If an arc-fault is present, then a switching signal 155 is transmitted to the switch 150 to disconnect the connector 130, thereby isolating the arc-fault in PV string 120.

In general, the connector 130 transmits DC current through the PV system and to the invertor 110, which converts the DC current into usable AC current. The resultant AC current is then transmitted to a grid. However, various other signals may also be detectable in connectors for a PV system. For instance, noise in the connector can arise from electromagnetic coupling (crosstalk), inverter switching, and other RF effects. Furthermore, when an arc-fault is present in a PV string, then AC noises can also be detected in the connector. For example, an arc in the PV string between modules 121, 122 can result in AC noise that is detectable in an electrical signal conveyed by the connector. FIG. 1B is an exemplary noise profile showing current and frequency measurements on a DC connector during an arc-fault. As can be seen, the arc-fault produces a current spike across various frequencies from 0.99 to 91.48 kHz.

The location of the arc-fault can be determined by the present system. For instance, each PV string 120 can be associated with a filter 160 having a unique cutoff frequency $f_n$, where electrical signals having a frequency above $f_n$ are attenuated. For instance, the filter 120 can be a lowpass filter having an $f_n$ of about 10 kHz, thereby providing an expected attenuated signal for all signals above 10 kHz (labeled with dashed box and arrow in FIG. 1B). Usually, the AFD operates by detecting current amplitudes across various frequencies. When the PV system is operating safely, then AC noises are not detected. When an arc-fault is present, then the AC noise profile will include current spikes across various frequencies. In the present system, the AC noise profile will also have an arcing noise cutoff frequency $f_{an}$, i.e., the frequency of the AC noise profile at which the current amplitude is attenuated. For instance, if the filter's $f_n$ for a particular PV string is about 10 kHz, then the $f_{an}$ for the AC noise profile associated with that filter will also be about 10 kHz. In this manner, the AC noise profile provides information about the presence of an arc-fault (i.e., by the presence of AC spikes) and the location of the fault (i.e., by the unique arcing noise cutoff frequency $f_{an}$ associated with a unique filter within the PV system). By recalling the location of the filter having a cutoff frequency $f_n$ equal to noise cutoff $f_{an}$, the location of the arc-fault is identified. A skilled artisan would understand that this analysis can be conducted for a filter having a cutoff frequency range.

In particular embodiments, the system includes two or more PV strings. FIG. 2A provides a PV system 200 having two PV strings 220, 320. The system 200 includes an inverter 210, an AFD 240, and a combiner 215, which combines the DC signals from the PV strings 220, 320.

The first PV string 220 includes a connector 230 connecting the first PV modules 221-224. The first filter (filter A 260) is configured to receive an electrical signal from a first current probe (probe A 270) and to transmit a filtered electrical signal to the AFD 240. In addition, the first switch (switch A 250) is configured to receive a switching signal from the AFD 240.

The second PV string 320 is configured similarly to the first PV string. For instance, the second PV string 320 includes a connector 330 connecting second PV modules 321-324. A second filter (filter B 360) and a second switch (switch B 350) are configured to be electrically connected to a second current probe (probe B 370) on the second string 320.

As compared to FIG. 1A, the AFD 240 in FIG. 2A must be configured to associate each unique filter to the switch that will disconnect the appropriate PV string. For instance, filter A 260 is associated with the first PV string 220. Thus, the AFD 240 must be configured to process and analyze the filtered signal from filter A 260 and then send the appropriate switching signal to switch A 250 based on this filter signal. Similarly, filter B 360 should be associated with switch B 350. Thus, the AFD 240 must be configured to process and analyze the filtered signal from filter B 360 and then send the appropriate switching signal to switch B 350 based on this filter signal.

Figure 2B:
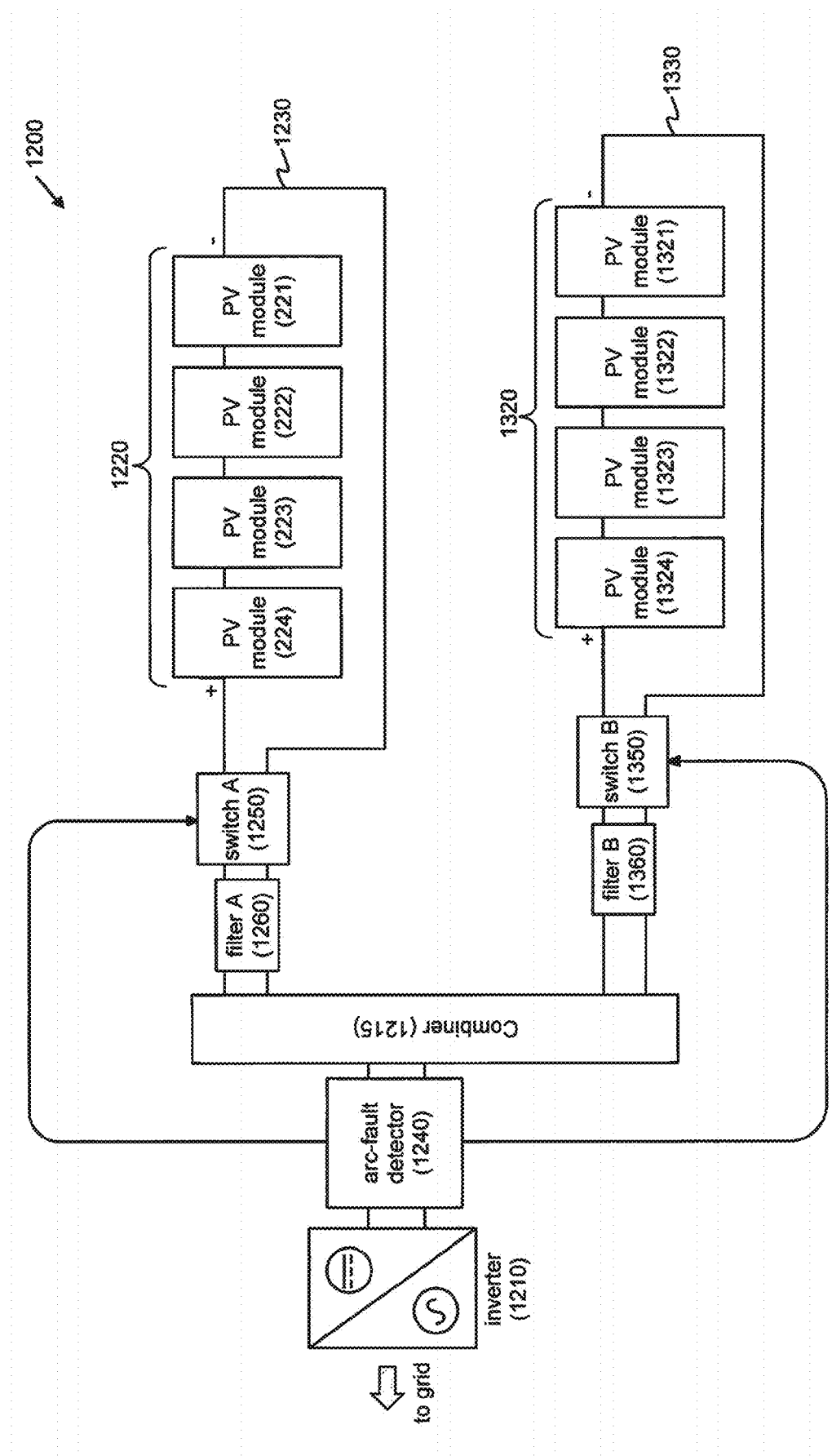
FIG. 2B shows schematics of another exemplary PV systems having two PV strings. Having an alternative system 1200 with the filters 1260, 1360 on the PV DC conductors 1230, 1330 and not on the current measurement. The filter/switch order can be reversed. The arc-fault detector (AFD) 240, 1240 can be located in any useful position of the system. Thus, noise from each of the strings can be collected and then filtered before being sent to the AFD (e.g., as in FIG. 2A-2B) or the AFD can be located somewhere else.

FIG. 2B provides an alternative configuration for the system 1200, in which the filter is located on the PV DC conductors and not on the current measurement from the probe. For instance, the PV system 1200 has two PV strings 1220, 1320. The system 1200 includes an inverter 1210, an AFD 1240, and a combiner 1215, which combines the DC signals from the PV strings 1220, 1320.

The first PV string 1220 includes a connector 1230 connecting the first PV modules 1221-1224. The first filter (filter A 1260) is configured to receive an electrical signal from the first string 1220, and the filtered signal is relayed to the AFD 1240 through the combiner 1215. The first switch (switch A 1250) is configured to receive a switching signal from the AFD 240.

The second PV string 1320 is configured similarly to the first PV string. For instance, the second PV string 1320 includes a connector 1330 connecting second PV modules 1321-1324. A second filter (filter B 1360) and a second switch (switch B 1350) are configured to be electrically connected to the second string 1320.

In particular embodiments, the PV system includes at least one AFD associated with a plurality of PV strings, where each PV string has a unique filter.

Figure 3A:
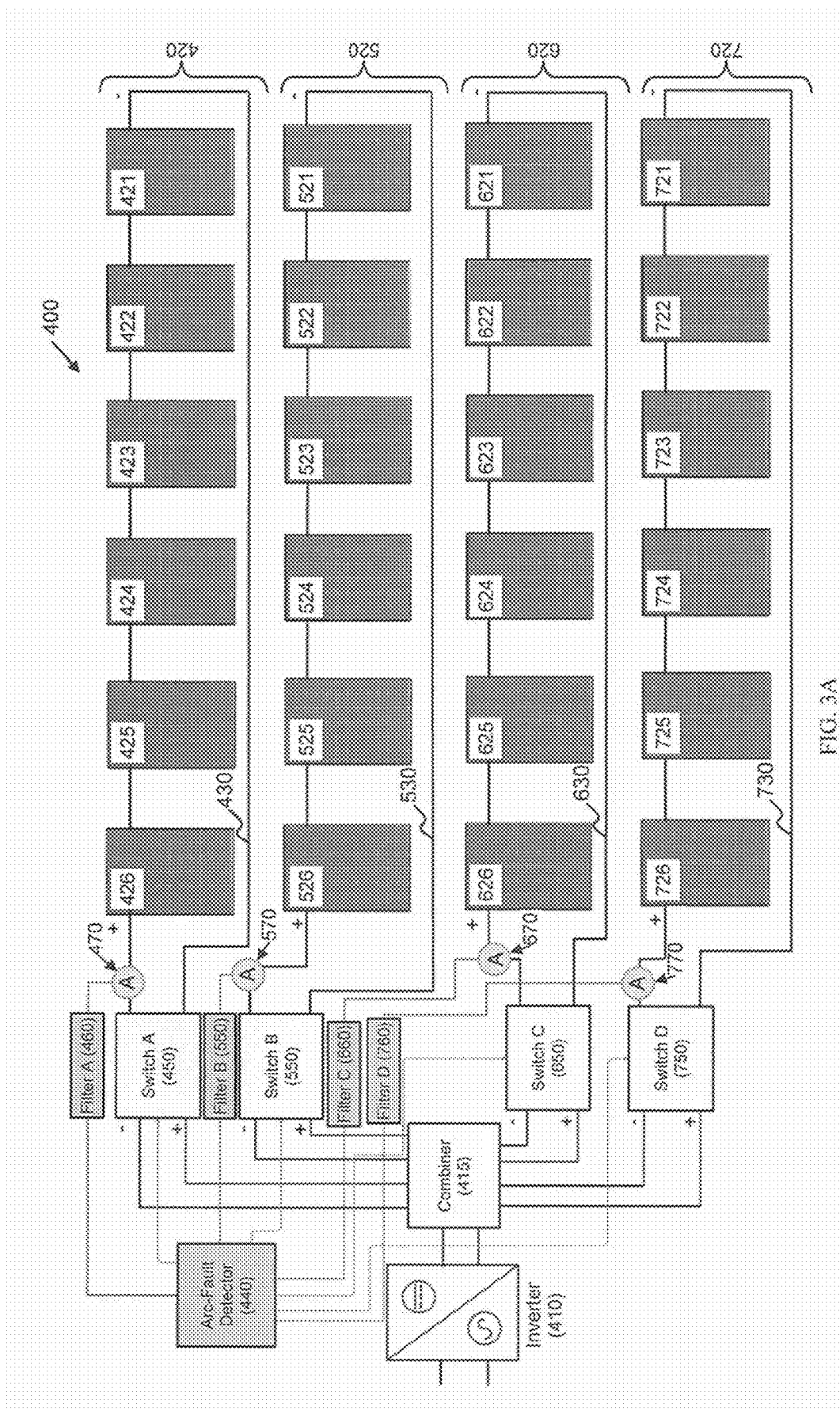
FIG. 3A shows another exemplary PV system 400 having multiple PV strings 420, 520, 620, 720.
Figure 3B:
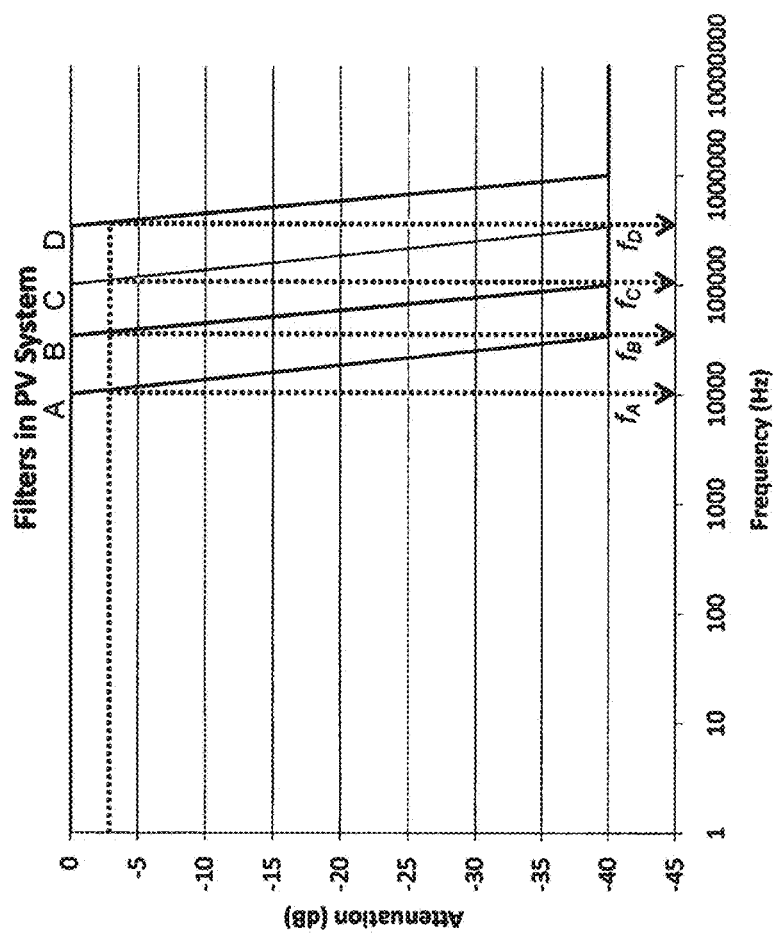
FIG. 3B shows a graph showing exemplary filters and cutoff frequencies $f_n$ (i.e., $f_A$-$f_D$).

Another exemplary PV system 400 is shown in FIG. 3A-3B. This system 400 includes a combiner box 415, an AFD 440, an inverter 410, and a plurality of PV strings (e.g., a first PV string 420, a second PV string 520, a third PV string 620, and a fourth PV string 720). Any useful number of PV strings may be used. For instance, the system can include 10, 20, 30, 40, 50, 100, 250, 500, 750, 1000, etc., PV strings. For some PV inverters reaching 1 MW (and larger), the number of strings for these systems can be 500 or more. In such system, strings can be optionally combined with a combiner box and then "recombined" in a larger recombiner before reaching the inverter.

Each string includes a plurality of PV modules and is electrically connected to a filter and a switch. For example, a first PV string 420 includes PV modules 421-426 connected to a first connector 430, a first filter (filter A 460) having a unique cutoff frequency $f_A$, a first probe 470, and a first switch (switch A 450). A second PV string 520 includes PV modules 521-526 connected to a second connector 530, a second filter (filter B 560) having a unique cutoff frequency $f_B$, a second probe 570, and a second switch (switch B 550). A third PV string 620 includes PV modules 621-626 connected to a third connector 630, a third filter (filter C 660) having a unique cutoff frequency $f_C$, a third probe 670, and a third switch (switch C 650). A fourth PV string 720 includes PV modules 721-726 connected to a fourth connector 730, a fourth filter (filter D 760) having a unique cutoff frequency $f_D$, a fourth probe 770, and a fourth switch (switch D 750). Optionally, one or more of the PV strings are electrically connected to a probe, such as component A in FIG. 3A (e.g., any probe described herein).

To ensure that the location of an arc-fault can be detected, the AFD is configured to associate the signals for each filter-switch pair. For instance, the AFD 440 is configured to receive the filtered signal from filter D 760, process this signal, and then, if appropriate, provide a corresponding switching signal to switch D 750 based on this processed signal.

The filters can be chosen to ensure that each cutoff frequency $f_n$ is unique. As shown in FIG. 3B, filters A-D are chosen so that each $f_n$ can be distinguished. In one embodiment, the cutoff frequency is chosen to be the frequency at which the signal is attenuated by about 3 dB. As seen in FIG. 3B, cutoff frequency $f_A$ for filter A is about 10 kHz, $f_B$ for filter B is about 30 kHz, $f_C$ for filter C is about 100 kHz, and $f_D$ for filter D is about 300 kHz.

When an arc occurs, it produces a range of noise across the frequency spectrum. It is possible to identify the string that this arc is on in a multi-string array with one arc detector by inserting multiple filters prior to the detector, as shown in FIG. 3A. Based on where the arcing noise cutoffs appear in the signal, the string with the arc-fault can be identified. FIG. 3B shows four filters for use in a four PV string system, where each filter (labeled "A"-"D") has a different cutoff frequency. By assessing the arcing noise cutoff frequency $f_{an}$ with filter cutoff $f_n$, the location of the arc-fault is identified.

Figure 4:
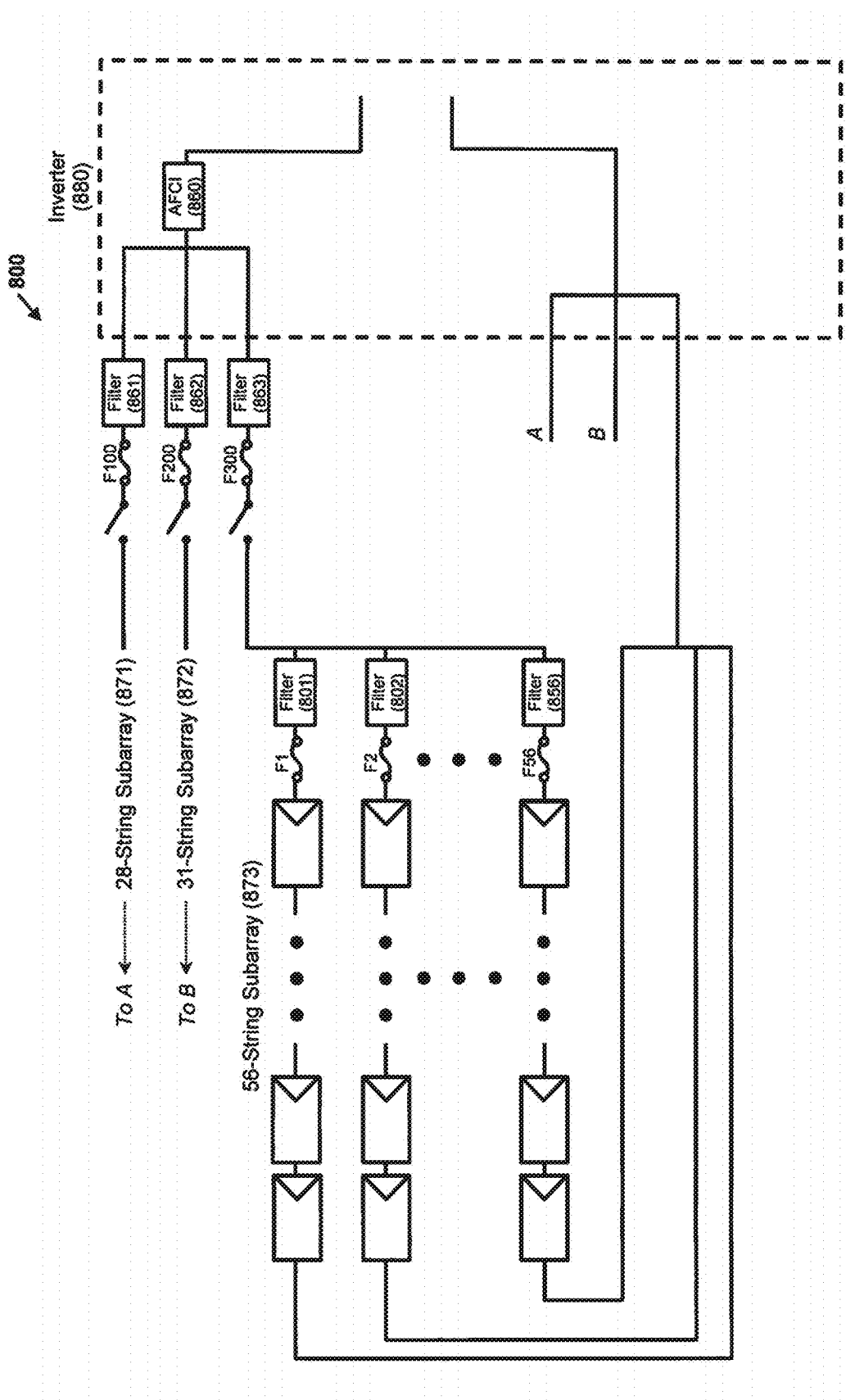
FIG. 4 is a schematic showing an exemplary PV system 800 including subarrays 871-873.

The system of the invention also includes those having subarrays. An exemplary system is provided in FIG. 4. As can be seen, system 800 includes three subarrays 871-873. The first subarray 871 includes 28 PV strings, the second subarray 872 includes 31 PV strings, and the third subarray 873 includes 56 PV strings. Each string in turn has a plurality of PV modules, where different numbers of modules can be provided for each string. The system 800 also includes an inverter 880 and an AFCI 860. Optionally, one or more fuses can be placed for each subarray (e.g., F100, F200, and F300) or for each PV string (e.g., F1-F56).

Filters having different cutoff frequencies can be placed within the system to identify the particular subarray. For instance, in FIG. 4, a first filter 861 is electrically connected to the 28-string subarray 871, a second filter 862 to the 31-string subarray 872, and a third filter 863 to the 56-string subarray 873. Each of these first, second, and third filters can be chosen to have differing cutoff frequencies (e.g., as in a lowpass filter) or range of cutoff frequencies (e.g., as in a bandpass filter). Thus, by assessing the noise signal, the subarray location of an arc-fault can be deduced. To provide further specificity, one or more filter can be placed within each PV string (e.g., filters 801-856 for each string in the 56-string subarray 873), such that the string location can be determined. Additional configurations can be designed to provide location specificity.

Photovoltaic Strings and Modules

The system of the invention includes an array of PV strings, where each string is electrically connected to an inverter. Each PV string, in turn, is composed of a plurality of PV modules and a connector.

The PV module includes an array of solar cells. Such modules and solar cells can be composed of any useful material (e.g., silicon (e.g., monocrystalline Si, crystalline Si (c-Si), polycrystalline Si (p-Si), or amorphous silicon (a-Si)), cadmium (e.g., cadmium telluride (CdTe) and cadmium sulphide (CdS)), organic polymers, thin film materials (e.g., gallium arsenide (GaAs), copper, cadmium telluride (CdTe), indium diselenide ($CuInSe_2$), and titanium dioxide ($TiO_2$)), as well as combinations thereof) and provided in any useful format (e.g., a PV string including m PV modules between about 30 W to about 400 W (e.g., where m is any useful integer, such as 4, 6, 7, 8, 10, 12, 20, 25, 50, etc.).

Any useful connector can be used to electrically connect the PV modules (e.g., a cable, a Y-connector, etc.).

Filters and Switches

The present invention employs filters and switches to identify the location of arc-faults and to de-energize those faults at the identified location. In particular, the system includes filters configured to provide unique filtered noise profiles and a particular switch configured to receive switching signals based on analysis of a particular filtered noise profile.

The filter can be configured in any useful location in the system. For example, as described herein, the filter can be located within a PV string, PV subarray, or PV array or even after the combiner (e.g., at the recombiner level). In another example, the filter is located on both the positive and negative conductors of the PV string (or across them) in the arc-fault detection/locating scheme since the current noise could propagate through the electrical circuit in the opposite direction to the AFD. Thus, the filter can be located directly on the positive and/or negative conductors of the string (e.g., as in FIG. 2B); located downstream of a probe that measure current, voltage, or other electrical parameters (e.g., as in FIG. 2A); or even located after the combiner at the recombiner level, as well as any other useful location in the system.

Exemplary filters include, independently, one or more analog filters, digital filters, active filters, passive filters, discrete-time (sampled) filters, continuous-time filters, high-pass filters, low-pass filters, bandpass filters, pi filters, band-reject (notch) filters, etc. Each of these filters is characterized by one or more cutoff frequencies $f_n$, below and/or above which signal is attenuated. Analog or digital filters can be used when working with the current or voltage measurement. For filtering the PV power directly (e.g., as in FIG. 2B), an analog filter with power components can be employed. For instance, in a lowpass filter, the cutoff frequency $f_n$ is the breakpoint between the accept band and the reject band. A lowpass filter passes all frequencies below $f_n$ and attenuates frequencies above $f_n$. Exemplary lowpass filter and $f_n$'s are provided in FIG. 3B. In some embodiments, each filter n has a unique $f_n$ that is characterized by the frequency at which the passband response falls off by about 3 dB. For example, filter A in FIG. 3B has an $f_A$ of about 10,000 Hz.

In a similar manner, $f_n$ can be determined for any type of filter. For instance, a notch filter usually rejects frequencies between two cutoff frequencies, e.g., $f_{n,low}$ and $f_{n,high}$. Thus, systems having one or more notch filters will provide a noise profile having a reject band between $f_{n,low}$ and $f_{n,high}$.

Any useful switches can be incorporated into the system of the invention to electrically connect and disconnect a PV string. Exemplary switches include, independently, one or more contactors, semiconductor switches (e.g., insulated gate bipolar transistors (IGBTs) or field effect transistors (FETs), such as metal oxide semiconductor field effect transistors (MOSFETs)), semi-conductor devices (power transistors and solid state relays), diodes, fuses, and/or remotely triggered switched devices, as well as combinations thereof. The switch and filter can be configured to transmit and/or receive a digital or analog trigger signal.

Arc-Fault Detectors

Many arc-fault detectors use elevated AC noise on the DC side of the PV system to detect arc-faults. In some embodiments, the AFD captures the noise from multiple frequencies using a current transformer and trip a switch when all the frequencies reach a threshold for a predefined period of time.

The AFD can include any useful structure to detect one or more AC noises arising from an arc-fault. For instance and without limitation, the AFD can include an analog front end that provides an analog signal corresponding to current in the PV module or string; an analog-to-digital converter (ADC) to convert the analog signal to a digital signal; optionally, a filter (e.g., a high-pass filter or an analog bandpass filter for filtering AC noise); and a microcontroller configured to receive the digital signal for signal processing (e.g., with FFT) and for signal detection (e.g., with a detection algorithm). In some embodiments, the microcontroller is configured to relay an output signal when an arc-fault is detected. In some embodiments, the analog front end includes a current transformer configured to allow current from the PV module or string to flow through the primary coil, thereby reacting to the AC noise present in the string; an amplifier configured to receive a signal from the secondary coil of the transformer; and a filter configured to receive the amplified signal from the amplifier.

In some embodiments, the analog signal is a DC voltage signal detected at various frequency bands (e.g., from 40-100 kHz). In other embodiments, the detection algorithm includes comparing the measured nominal power to a baseline measurement and determining whether the noise level increases suddenly over the baseline measurement.

In some embodiment, the arc-fault detection frequency is between about 1 kHz to about 100 kHz. Methods of optimizing detection frequencies are provided in Johnson J et al., "Using PV module and line frequency response data to create robust arc-fault detectors," *Proc. 26th Eur. Photovoltaic Solar Energy Conf Exhib.*, held Sep. 5-9, 2011 in Hamburg, Germany (SAND Technical Report No. SAND2011-6307C), which is incorporated herein by reference in its entirety.

Exemplary AFDs, as well as switches and filters, are described in U.S. Pat. Nos. 7,535,234, 8,218,274, and 8,547,669; U.S. Pub. No. 2012/0316804; Int. Pub. No. WO 2013/037740; Schimpf F et al., "Recognition of electric arcing in the DC-wiring of photovoltaic systems," *Proc.* 2009 *31st Int'l Telecommun. Energy Conf.* (*INTELEC* 2009), held Oct. 18-22, 2009 in Incheon, South Korea; Johnson J et al., "Series and parallel arc-fault circuit interrupter tests," Sandia Report No. SAND2013-5916, July 2013; Johnson J et al., "Photovoltaic DC arc-fault detector testing at Sandia National Laboratories," *Proc.* 2011 *37th IEEE Photovoltaic Spec. Conf.* (*PVSC*), held Jun. 19-24, 2011 in Seattle, Wash. (SAND2011-3871C); Johnson J et al., "Crosstalk nuisance trip testing of photovoltaic DC arc-fault detectors," *Proc.* 2012 *38th IEEE Photovoltaic Spec. Conf.* (*PVSC*), held Jun. 3-8, 2012 in Austin, Tex. (SAND Technical Report No. SAND2012-4441C); and Texas Instruments, "SM73201, SM73307, SM73308: Application Note 2154 SolarMagic SM73201 DC Arc Detection Evaluation Board," Literature Number: SNOA564A, 2011, each of which is incorporated herein by reference in its entirety.

Noise Injection

As described herein, the system of the invention includes one or more filters to identify the location of an arc-fault. The system can also include an injected noise signal, which can be used to locate "open" faults in the PV array. For instance, the injected noise signal can be introduced into the PV system after a series arc-fault or during commissioning to verify proper connection between the array components. In one embodiment, the injected noise signal is a broadband noise that is injected on either the positive or negative current carrying conductors and then measured on the opposite conductor. If the PV system is healthy, then the resulting noise signal from the system will reflect each $f_n$ for each filter. In contrast, if there is a break or fault on a particular string, then that string will be electrically disconnected and the injected noise signal will not be filtered by the filter on that string. Accordingly, the measured noise signal will lack that $f_n$ from the disconnected $f_n$ string. In this manner, the location of the arc-fault, ground-fault, or break can be identified. Further details are described in Example 2 herein.

Other Components

The PV system can include one or more additional useful components. Exemplary components include one or more of the following: a data acquisition system (e.g., configured to measure one or more electrical parameters, such as voltage of the PV system); a current transducer; a digitizer; an oscilloscope; an arc-fault classifier (e.g., a classifier having a resistance $R_1$ and two switches $S_1$ and $S_2$, where methods for designing such classifiers are described in Johnson J et al., "Differentiating series and parallel photovoltaic arc-faults," *Proc.* 2012 *38th IEEE Photovoltaic Spec. Conf.*, held Jun. 3-8, 2012 in Austin, Tex. (SAND Technical Report No. SAND2012-4443C), which is incorporated herein by reference in its entirety); a combiner including a main DC bus that busses together the plurality of PV strings into a single combined DC signal, optionally including a string protector (e.g., a fuse or a diode) connected to each PV string, thereby protecting that particular PV string against overcurrent or reverse current; a converter, such as AC/DC converters, AC/AC converters, DC/DC converters, and microconverters; an inverter, such as an DC/AC inverter; a transformer; a string protector, such as a diode and/or a rectifier; an alarm, optionally connected to a data acquisition system or a probe; and/or a probe, such as to measure an electrical parameter, such as voltage, current, and/or resistance.

Exemplary probes include a clamp type current probe clamped between a positive and negative portion of a string, a pick-up coil or a transformer used as a current probe, an FET-type voltmeter connected between two points in a string, a current Hall-effect Sensor model ACS714 (available from Allegro MicroSystems, Inc., Worcester, Mass.), and a voltage detector that is a resistor divider (Model MAX186, available from Maxim-IC, Sunnyvale, Calif.). Optionally, the system can include one or more control units (e.g., electrically connected to one or more probes and configured to calculate differences in electrical parameters between two or more strings).

Additional components are provided in U.S. Pub. Nos. 2013/0015875 and 2013/0335861, each of which is incorporated herein by reference in its entirety.

EXAMPLES

Example 1: PV System Having Filters and Detector

When an arc occurs, it produces a range of noise across the frequency spectrum (FIG. 1B). It is possible to identify the string that this arc is on in a multi-string array with one arc detector by inserting multiple filters prior to the detector (FIG. 3A). Based on where the arcing noise cutoffs appear in the signal (FIG. 3B), the string with the arc-fault can be identified. In a similar manner, a skilled artisan would be able to incorporate multiple filters and switches to further expand the PV system. The AFD can be configured to ensure that filter-switch pairs are properly configured, such that the filtered signal for a particular PV string is employed to determine whether the switch for that PV string should be activated.

Example 2: Noise Injection with a PV System Having Filters

There is currently no standardized method or go-to technology for finding arc-faults in PV systems after an arc-fault circuit interrupter (AFCI) has tripped; and the method for locating ground faults after the ground fault detector/interrupter (GFDI)—or equivalent protection—has tripped is a painstaking process for large PV systems, where smaller and smaller sections of the PV system are isolated until the location of the ground fault is determined (Mync P et al., "PV system ground faults," *SolarPro Mag.* 2009 August/September; 2.5:60-72). With a technology that can determine the string that contains the fault, a subsection of the PV system could be de-energized while leaving the rest of the PV array functioning. This will improve total power production and greatly accelerate the repair process.

Figure 5:
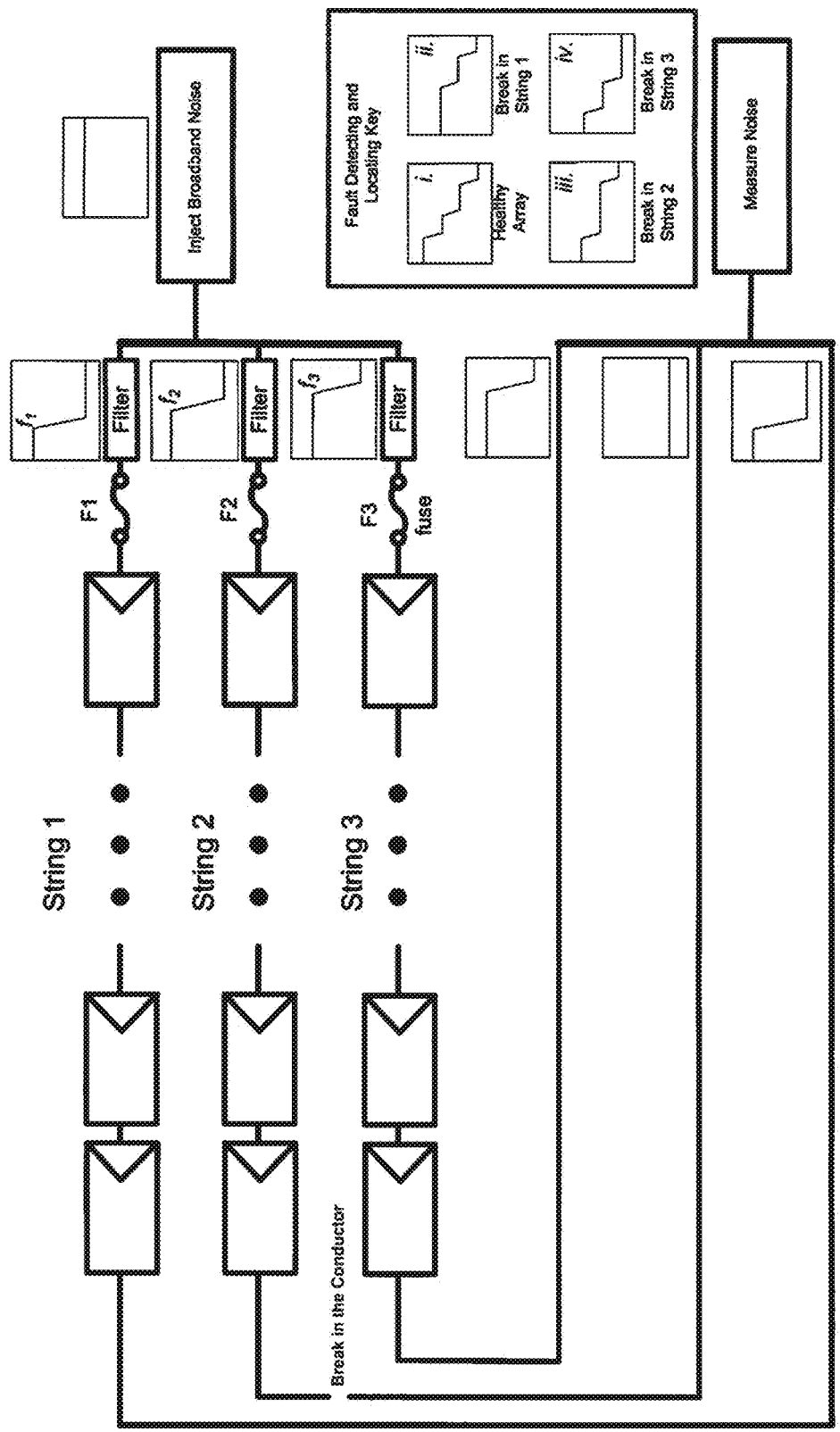
FIG. 5 is a schematic showing an exemplary technique for determining the location of a break or open in the PV system by injecting broadband noise. Each filter has a unique cutoff frequency, thereby providing a key associated with (i) a healthy array, (ii) a break in string 1, (iii) a break in string 2, and (iv) a break in string 3. By comparing the measured noise with unique noise spectra (i)-(iv) in the key, the location of a break can be identified.
Figure 6:
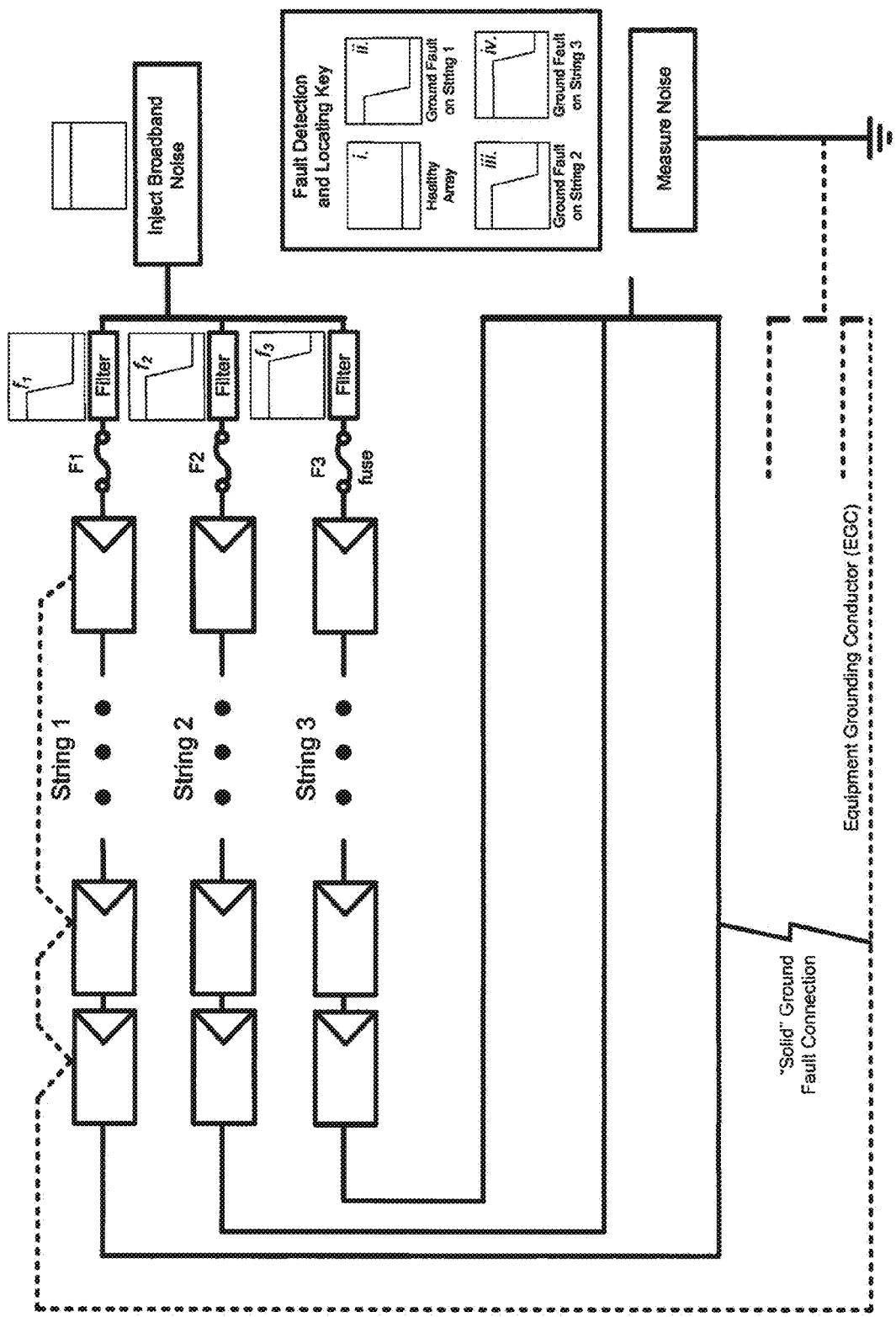
FIG. 6 is a schematic showing an exemplary technique for determining the location of an arc-fault in the PV system by injecting broadband noise. Each filter has a unique cutoff frequency, thereby providing a key associated with (i) a healthy array, (ii) a ground fault on string 1, (iii) a ground fault on string 2, and (iv) a ground fault on string 3. By comparing the measured noise with unique noise spectra (i)-(iv) in the key, the location of the arc-fault can be identified.

FIGS. 5 and 6 describes exemplary systems for locating an arc-fault. These systems rely on an injected noise signal (e.g., a broadband noise) into the PV system to determine which string has the fault. For instance, an AFCI or GFDI has been tripped, and the PV owner would like to quickly locate the fault on a multi-string array. After a series arc-fault, there will be a break or discontinuity in the conduction path. In addition, after a ground fault, there will be an additional conduction path between a current-carrying conductor (CCC) and the equipment grounding conductor. Broadband noise is injected into either the positive or negative CCC and measured on the other CCC for AFCI diagnostics (shown in FIG. 5) or measured on the ground bond for GFDI diagnostics (shown in FIG. 6).

By employing the fault detection and locating key, the location of the break or fault can be detected. For instance, as shown in FIG. 5, the system employs three filters, each having a unique $f_n$ (as shown by the graph above each filter, where each cutoff frequency $f_1$, $f_2$, and $f_3$ is different). When a break is not present, the injected broadband noise will be filtered by each filter in the PV string, and the resultant noise signal will be a linear combination of filtered signals having cutoff frequencies $f_1$, $f_2$, and $f_3$ (as shown in spectrum (i) in the key). In contrast, when a break is present in the string, then the injected noise signal will not be filtered by the filter associated with that string. For instance, when the break is present in string 2, the measured noise will lack cutoff frequency $f_2$ (as shown in spectrum (iii) in the key). Thus, the location of the break is identified.

Similarly, this method can be applied for identifying the location of ground faults. For instance, as shown in FIG. 6, noise signals are measured at the ground bond of the system. When an arc-fault is not present, there is no electrical connection between the PV system and the ground bond. Thus, the measured noise signal for a healthy array is an unfiltered signal (as shown in spectrum (i) in the key). In contrast, when a connection is made between the PV system and the ground fault connection, the measured noise signal will be filtered through the $n^{th}$ filter on the $n^{th}$ string having a fault. Thus, if there is a fault on string 1, the noise signal will have a cutoff frequency that is comparable to the $f_1$ for the filter on string 1 (as shown in spectrum (ii) in the key). In this manner, noise signals obtained either from the ground bond or the connector in the system can be used to determine the location of a break or an arc-fault.

Example 3: Real-Time Detection of Arc-Faults

Figure 7:
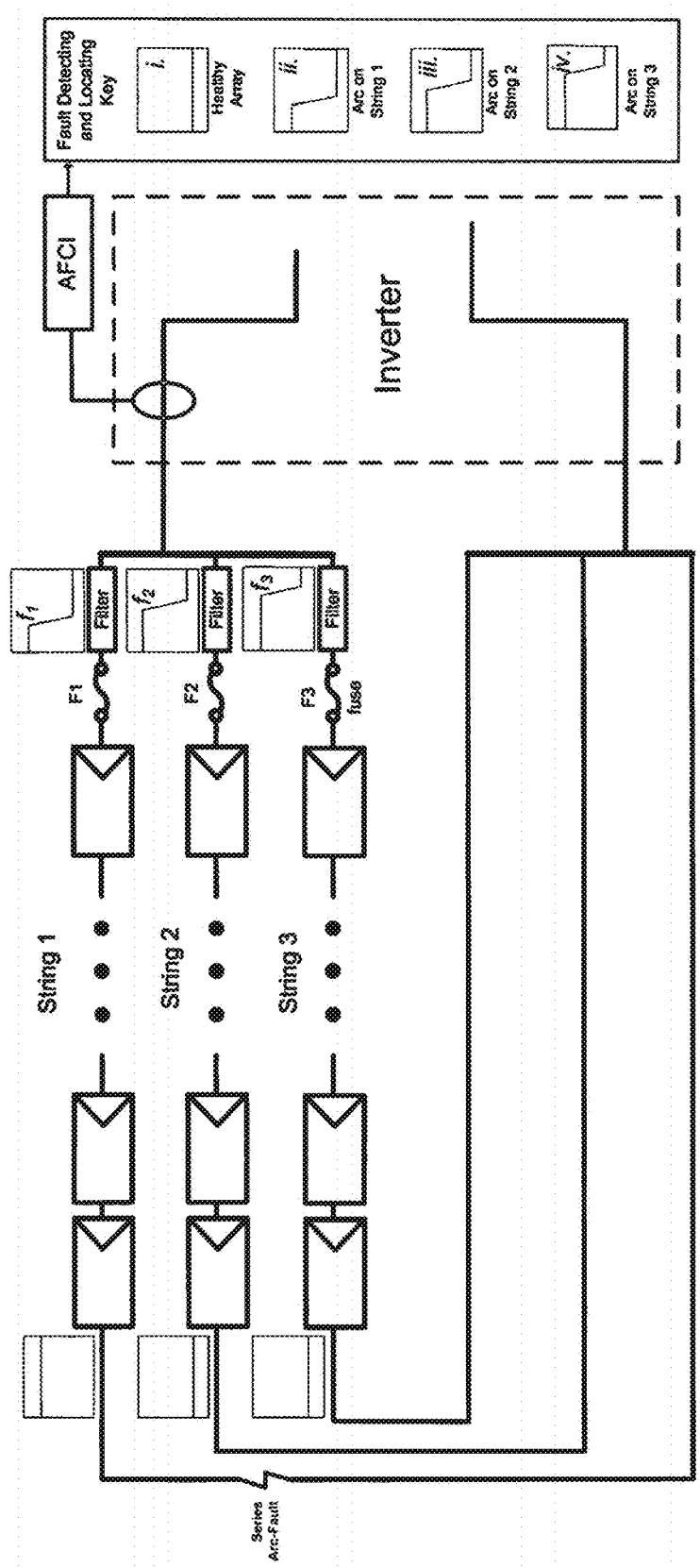
FIG. 7 is a schematic showing an exemplary technique for determining the location of an arc-fault in the PV system in real-time. Each filter has a unique cutoff frequency, thereby providing a key associated with (i) a healthy array, (ii) an arc on string 1, (iii) an arc on string 2, and (iv) an arc on string 3. By comparing the measured filtered noise signal with unique noise spectra (i)-(iv) in the key, the location of the arc-fault can be identified in real-time.

The present system also allows for identifying the arc-fault string in real-time. Arc-faults generate broadband noise (Johnson J et al., "Photovoltaic DC arc fault detector testing at Sandia National Laboratories," *Proc.* 2011 *37th IEEE Photovoltaic Spec. Conf.* (PVSC), held Jun. 19-24, 2011 in Seattle, Wash. (SAND Technical Report No. SAND2011-3871C) (6 pages)). Therefore, by placing low-pass filters (or other filters) on each string, the noise content reaching the AFCI will indicate which string has the arc-fault, as shown in FIG. 7. This information can be used to strategically shut down the portion of the array or to inform relevant personnel where to look for the faulty PV component.

Other Embodiments

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:
1. A photovoltaic system comprising:
a first photovoltaic (PV) string, wherein the first PV string comprises a plurality of first PV modules and a first connector configured to connect the plurality of first PV modules;
a first filter configured to receive an electrical signal from the first connector, wherein the first filter has a cutoff frequency $f_1$ or a range of cutoff frequencies $f_{1,low}$ to $f_{1,high}$;
a first switch configured to connect or disconnect the first connector;
a second PV string, wherein the second PV string comprises a plurality of second PV modules and a second connector configured to connect the plurality of second PV modules;
a second filter configured to receive an electrical signal from the second connector, wherein the second filter has a cutoff frequency $f_2$ or a range of cutoff frequencies $f_{2,low}$ to $f_{2,high}$ that is different than $f_1$ or range of $f_{1,low}$ to $f_{1,high}$, if present;
a second switch configured to connect or disconnect the second connector; and
a first probe to measure an electrical parameter, wherein the first probe is configured to receive an electrical signal from the first connector and the first filter is configured to receive an electrical signal from the first probe.
2. The photovoltaic system of claim 1, further comprising an arc-fault detector configured to receive a filtered electri- cal signal from each of the first and second filters and to transmit a switching signal to each of the first and second switches.

3. The photovoltaic system of claim 1, wherein the first filter is electrically connected to a positive and/or negative direct current input of the first PV string.

4. The photovoltaic system of claim 3, wherein the first filter and the first switch are arranged in parallel in the photovoltaic system.

5. The photovoltaic system of claim 4, wherein the second filter and the second switch are arranged in parallel in the photovoltaic system.

6. The photovoltaic system of claim 1, wherein the arc-fault detector comprises:
- an analog front end configured to receive the filtered electrical signal;
- an analog-to-digital converter configured to convert the filtered electrical signal to a digital signal; and
a microcontroller configured to analyze the digital signal for the presence of an arc-fault.

7. The photovoltaic system of claim 6, wherein the microcontroller comprises an algorithm configured to:
- determine a presence of an arc-fault in the digital signal;
- identify an arcing noise cutoff frequency $f_{an}$ for the digital signal;
- compare the arcing noise cutoff frequency $f_{an}$ with the cutoff frequencies $f_1$, $f_{1,low}$ to $f_{1,high}$, $f_2$, and $f_{2,low}$ to $f_{2,high}$, if present; and
- transmit the switching signal to the first switch if $f_{an}$ is comparable to $f_1$ or range of $f_{1,low}$ to $f_{1,high}$ or transmit the switching signal to the second switch if $f_{an}$ is comparable to $f_2$ or range of $f_{2,low}$ to $f_{2,high}$.

8. The photovoltaic system of claim 1, further comprising:
- a combiner configured to combine an electrical signal from each of the first and second connectors and to transmit a single electrical output; and
- an inverter configured to receive the single electrical output.

9. The photovoltaic system of claim 8, further comprising a recombiner and a filter configured to receive an electrical signal from the recombiner.

10. The photovoltaic system of claim 8, further comprising:
- n PV string(s) and n connector(s), wherein each $n^{th}$ PV string comprises a plurality of PV modules and wherein each $n^{th}$ connector is configured to connect the plurality of PV modules in one $n^{th}$ PV string;
- n filter(s), wherein each $n^{th}$ filter is configured to receive an electrical signal from one $n^{th}$ connector, each $n^{th}$ filter has a cutoff frequency $f_n$ or range of cutoff frequencies $f_{n,low}$ to $f_{n,high}$ and each $f_n$ or range of $f_{n,low}$ to $f_{n,high}$ is different; and
- n switch(es), wherein each $n^{th}$ switch is configured to connect or disconnect one $n^{th}$ connector,
wherein n is an integer of from 1 to 1000.

11. The photovoltaic system of claim 10, wherein each of the first, second, and $n^{th}$ filters is, independently, selected from the group consisting of a low bandpass filter, a notch filter, an analog filter, a digital filter, an active filter, a passive filter, a discrete-time or sampled filter, a continuous-time filter, a high-pass filter, low-pass filter, a bandpass filter, and a pi filter.

12. The photovoltaic system of claim 1, wherein the first PV string and the second PV string are both located in a first subarray.

13. The photovoltaic system of claim 12, further comprising a third filter configured to receive an electrical signal from the first subarray, wherein the third filter has a cutoff frequency $f_3$ or a range of cutoff frequencies $f_{3,low}$ to $f_{3,high}$, and wherein each of $f_1$, range of $f_{1,low}$ to $f_{1,high}$, $f_2$, range of $f_{2,low}$ to $f_{2,high}$, $f_3$, and range of $f_{3,low}$ to $f_{3,high}$, if present, is different.

14. The photovoltaic system of claim 13, further comprising a second subarray, wherein the second subarray comprises one or more PV strings and a fourth filter having a cutoff frequency $f_4$ or a range of cutoff frequencies $f_{4,low}$ to $f_{4,high}$.

15. The photovoltaic system of claim 1, wherein the first PV string is located in a first subarray and the second PV string is located in a second subarray.

16. The photovoltaic system of claim 15, wherein the first subarray comprises a third filter and the second subarray comprises a fourth filter.

17. A photovoltaic system comprising:
- a plurality of photovoltaic (PV) strings, wherein each PV string comprises a plurality of PV modules;
- a plurality of connectors; wherein each connector is configured to connect the PV modules of one PV string;
- a plurality of filters, wherein each filter is configured to receive an electrical signal from one connector and each filter has a different cutoff frequency;
- a plurality of switches, wherein each switch is configured to connect or disconnect one connector;
- an arc-fault detector configured to receive a plurality of filtered electrical signals and to transmit a plurality of switching signals;
- a combiner configured to combine an electrical signal from each connector and to transmit a combined signal; and
- an inverter configured to receive the combined signal
- a first probe to measure an electrical parameter, wherein the first probe is configured to receive an electrical signal from a first connector of the plurality of connectors and a first filter of the plurality of filters is configured to receive an electrical signal from the first probe.

18. A method of identifying the location of an arc-fault in a photovoltaic (PV) system and isolating the arc-fault, the method comprising:
- obtaining a plurality of first filtered current signals having a cutoff frequency $f_1$ or a range of cutoff frequencies $f_{1,low}$ to $f_{1,high}$, wherein each first filtered current signal is obtained at a different frequency and measured for a first connector configured to connect a plurality of PV modules of a first PV string;
- analyzing the first filtered current signals to determine a presence of an arc-fault in the first PV string;
identifying an arcing noise cutoff frequency $f_{a1}$ if the first filtered current signals includes the arc-fault; and
- comparing the arcing noise cutoff frequency $f_{a1}$ with the cutoff frequency $f_1$ or the range of $f_{1,low}$ to $f_{1,high}$, thereby identifying and isolating the arc-fault in the PV system;
- opening a first switch connected to the first PV string if $f_{a1}$ is comparable to $f_1$ or the range of $f_{1,low}$ to $f_{1,high}$;
- prior to the obtaining step, injecting a noise signal into the PV system, wherein the noise signal is used to provide the plurality of first filtered current signals; and
- after the comparing step, opening a first switch connected to the first PV string if $f_{a1}$ does not comprise $f_1$ or the range of $f_{1,low}$ to $f_{1,high}$.

19. The method of claim 18, further comprising:
- obtaining a plurality of second filtered current signals having a cutoff frequency $f_2$ or a range of cutoff frequencies $f_{2,low}$ to $f_{2,high}$, wherein each second filtered current signal is obtained at a different frequency and measured for a second connector configured to connect a plurality of PV modules of a second PV string;

analyzing the second filtered current signals to determine a presence of an arc-fault in the second PV string;

identifying an arcing noise cutoff frequency $f_{a2}$ if the second filtered current signals includes the arc-fault; and comparing the arcing noise cutoff frequency $f_{a2}$ with the $f_2$ or the range of $f_{2,low}$ to $f_{2,high}$.

20. The method of claim 18, further comprising opening a second switch connected to the second PV string if $f_{a2}$ is comparable to $f_2$ or the range of $f_{2,low}$ to $f_{2,high}$.

21. The method of claim 18, further comprising:

prior to the obtaining step, injecting a noise signal into the PV system, wherein the noise signal is used to provide the plurality of first and/or second filtered current signals; and after the comparing step, opening a first switch connected to the first PV string $f_{a1}$ does not comprise $f_1$ or the range of $f_{1,low}$ to $f_{1,high}$ and/or opening a second switch connected to the second PV string if $f_{a2}$ does not comprise to $f_2$ or the range of $f_{2,low}$ to $f_{2,high}$.

22. A method of identifying the location of an arc-fault or a break in a photovoltaic (PV) system, the method comprising:

measuring a filtered noise signal in the system;

identifying one or more noise cutoff frequencies $f_{an}$; and comparing $f_{an}$ with cutoff frequency $f_n$ or the range of $f_{n,low}$ to $f_{n,high}$ for one or more filters in the system, thereby identifying the arc-fault or the break in the PV system; and prior to the measuring step, injecting a broadband noise signal to provide the filtered noise signal.

23. The method of claim 22, wherein the measuring step comprises measuring the filtered noise signal in a connector of the system, and the method further comprises, after the comparing step, identifying the break in an $n^{th}$ PV string if $f_{an}$ does not comprise $f_n$ or the range of $f_{n,low}$ to $f_{n,high}$.

24. The method of claim 22, wherein the measuring step comprises measuring the filtered noise signal in a ground bond of the system, and the method further comprises, after the comparing step, identifying the arc-fault in an $n^{th}$ PV string if $f_{an}$ comprises $f_n$ or the range of $f_{n,low}$ to $f_{n,high}$.

25. The method of claim 22, wherein the measuring step comprises measuring the filtered noise signal in an arc-fault detector of the system, and the method further comprises, after the comparing step, identifying the arc-fault in an $n^{th}$ PV string if $f_{an}$ comprises $f_n$ or the range of $f_{n,low}$ to $f_{1,high}$.

* * * * *